(12) United States Patent
Akiha

(10) Patent No.: US 6,384,345 B1
(45) Date of Patent: May 7, 2002

(54) THREE DIMENSIONAL CIRCUIT BODY AND METHOD OF MANUFACTURING THE SAME

(75) Inventor: Yoshinobu Akiha, Susono (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/686,171

(22) Filed: Oct. 12, 2000

(30) Foreign Application Priority Data

Oct. 13, 1999 (JP) .......................................... 11-291498

(51) Int. Cl.$^7$ .............................................. H01R 23/68
(52) U.S. Cl. ........................ 174/261; 174/258; 148/24; 216/13; 428/209; 438/669
(58) Field of Search .............................. 174/261, 256, 174/255; 148/24; 216/13; 428/209; 427/388.1; 361/777; 438/669; 29/890.1

(56) References Cited

U.S. PATENT DOCUMENTS

| | | | | |
|---|---|---|---|---|
| 4,789,411 A | * | 12/1988 | Eguchi et al. | 148/24 |
| 4,914,260 A | * | 4/1990 | Suzuki et al. | 174/256 |
| 5,544,773 A | * | 8/1996 | Haruta et al. | 216/13 |
| 5,917,157 A | * | 6/1999 | Remsburgh | 174/255 |
| 6,245,432 B1 | * | 6/2001 | Funada et al. | 428/209 |

FOREIGN PATENT DOCUMENTS

| | | | | |
|---|---|---|---|---|
| DE | 195 02 044 A1 | 7/1996 | | H05K/3/14 |
| EP | 0 886 461 A1 | 12/1998 | | H05K/1/09 |
| JP | 4-239795 | 8/1992 | | H05K/3/18 |
| JP | 5-325637 | 12/1993 | | H01B/1/22 |
| JP | 8-204315 | 8/1996 | | H05K/3/20 |

OTHER PUBLICATIONS

Patent abstract of Japan 05325637 Dec. 10, 1993.
Patent abstract of Japan 08204315 Aug. 9 1996.

* cited by examiner

*Primary Examiner*—Albert W. Paladini
(74) *Attorney, Agent, or Firm*—Sughrue Mion, PLLC

(57) ABSTRACT

The three-dimensional circuit body of the present invention is obtained by the steps of forming an insulating layer formed on the three-dimensional, that is, corrugated car body frame, discharging conductive paste along the surface of the insulating layer and curing the conductive paste simultaneously with discharging operation to form the circuit patterns. The circuit pattern is formed by moving the discharging unit and curing unit along the insulating layer formed on the surface of the car body frame, while discharging the conductive paste from the discharging unit onto the insulating layer and curing the same simultaneously with discharging operation, thereby simplifying the manufacturing process of the three dimensional circuit body and reducing consumption of material.

5 Claims, 2 Drawing Sheets

THREE DIMENSIONAL CIRCUIT BODY AND METHOD OF MANUFACTURING THE SAME

BACKGROUND OF THE INVENTION

1. Field of Invention

The present invention relates to a three dimensional circuit body having a conductive circuit pattern formed on a three-dimensionally curved or bent surface of, for example, various vehicle body frames or the like; and a method of manufacturing a three-dimensional circuit body having a circuit pattern formed on such a curved or bent surface.

2. Related Art

Recent years, a number of wire harness have been used in the vehicle such as automotive vehicle for mounting various electronic equipment and connecting between such electronic equipment. Therefore, wiring operation of wire harness is performed in the production line or during maintenance operation, and such wiring operation has been consuming time and manpower.

Conventionally, printed-wiring boards have often been used for electronic equipment. However, since the conventional circuit pattern is manufactured in such a manner that a flat circuit pattern is formed by corroding a copper foil formed on the flat circuit board by etching technique, it cannot be employed to a member having a curved or bent surface, such as a car body frame.

Accordingly, a various proposals have been presented as a method of forming a circuit pattern on the circuit board. For example, in "Method of manufacturing injection molded circuit components" disclosed in Japanese Patent Laid-Open No.4-239795, a first resin layer containing a catalyst for enhancing a property to accept plating is formed by injection molding. Then, a second resin layer being impregnated with oil for disabling application of plating thereon is formed on the upper surface of the first resin layer, thereby fabricating the circuit component body with the first resin layer exposed along the position where the circuit pattern is to be formed.

Then electroless copper plating is applied on the upper surface of the circuit component body, and a layer of conductive material to be a circuit pattern is laminated on the upper surface of the first resin layer to complete the injection molded circuit component.

"Resin composition for electric resin" disclosed in Japanese Patent Laid-Open No. 5-325637 relates to a conductive material for forming a circuit pattern, that is, a mixture of metal fibers such as copper fibers, brass fibers, aluminium fibers, or stainless fibers; low-melting metals such as generally used solder, high temperature solder, or low temperature solder; flux; and a synthetic resin.

The "Method of manufacturing circuit board" disclosed in Japanese Patent Laid-Open No.8-204315 comprises the steps of forming a layer of metallic plate as a circuit body on the molding surface of the mold by electrolytic plating, pressing the mold against the substrate formed of a thermoplastic resin, heating the mold and holding it onto the substrate to adhere the circuit body onto the substrate by heat, and then separating the mold from the substrate after the substrate is cooled down so that the circuit body is transferred onto the substrate.

In the "Method of manufacturing circuit board" disclosed in Japanese Patent Laid-Open No. 4-239795, however, palladium chloride is used as a catalyst for electroless plating, which is very expensive, thereby increasing the cost of the injection molded circuit component.

In addition, since the second resin layer has to be formed on the first resin layer so that the portion of the first resin layer to be applied a circuit pattern is left exposed, both the structure of the mold and the manufacturing steps are complicated, and thus it has been difficult to form a circuit pattern on the three dimension structure of complex configuration such as a car body frame.

As regards the "Resin composition for electric resin" disclosed in Japanese Patent Laid-Open No.5-325637, there has been a problem in that low-melting metals used in this composition are expensive, which is one of the reasons of high cost. In addition, as a recent tendency, it is required to consider the environmental issues for every product. However, using an alternative material to lead compound that is not preferable for environment further increases the cost.

In the "Method of manufacturing circuit board" disclosed in Japanese Patent Laid-Open NO.8-204315, since a specific mold for forming the circuit body have to be provided and an additional step of transferring the circuit body to the circuit board by pressing the mold onto the circuit board is included, there has been a problem in that these circumstances conspire to increase the cost. In other words, it has been difficult to form a circuit pattern easily on the surface of the three-dimensional structure along the surface of the complex profile such as the car body frame.

SUMMARY OF INVENTION

Accordingly, with the circumstances described above in view, it is an object of the invention to provide a three-dimensional circuit body in which a circuit pattern is formed along the surface of the substance of a three-dimensional configuration, such as a car body frame, and the method of manufacturing the same.

The problems described above associated with the present invention may be solved by the third-dimensional circuit body comprising a car body frame having a three dimensional configuration, an insulating layer formed along the surface configuration of the car body frame, and a circuit pattern formed by applying and simultaneously curing conductive paste on the surface of the insulating layer.

According to the three-dimensional circuit body having the structure described above, since the circuit pattern is formed by the steps of forming an insulating layer along the corrugated surface for example of the car body frame, and applying and simultaneously curing conductive paste along the surface of the insulating layer, conductive paste can be applied along the surface configuration of the car body frame even when the surface configuration is complicated, thereby simplifying the formation of the circuit pattern and reducing the cost therefor.

In the three-dimensional circuit body of the invention, the insulating layer is preferably any one of a hard material formed along the surface configuration of the car body frame, a soft material to be adhered along the car body frame, and a thin film formed in a layer. In the three-dimensional circuit body of the invention, the circuit pattern is preferably formed in a configuration being separated or being intersected with respect to each other.

According to the three-dimensional circuit body of the invention, the mold for forming the circuit pattern is not necessary and the circuit pattern may be formed in a configuration being separated or partly intersected depending on the configuration of the portion to which the circuit pattern is applied, thereby reducing the cost and enhancing the flexibility of wiring.

The problems associated with the present invention may be solved by a method of manufacturing a three dimensional circuit body by forming a circuit pattern on the surface of a three-dimensional car body frame by discharging conductive paste on the surface of the three-dimensional substance while moving a discharging unit, comprising the steps of moving the discharging unit along the surface configuration of the insulating layer formed along the three-dimensional car body frame, discharging the conductive paste from said discharging unit onto said insulating layer, and curing said conductive paste by a curing unit moving unitarily with said discharging unit simultaneously with discharging operation.

According to the method of manufacturing the three-dimensional circuit body having a structure described above, the circuit pattern is formed by forming an insulating layer on the surface of the three-dimensional car body frame, moving the discharge unit and curing unit simultaneously along the surface thereof, and discharging conductive paste from the discharge unit onto the insulating layer while curing it simultaneously. Therefore, even when the surface of the car body frame is corrugated, the circuit pattern may be formed along the configuration thereof, thereby simplifying the manufacturing process and reducing material to be used.

In the method of manufacturing the three-dimensional circuit body, the conductive paste is preferably made by adding phenol resin to conductive metal powder so that the surface thereof is changed to have an insulating property when cured.

According to the method of manufacturing the three-dimensional circuit body of the invention, the circuit pattern may be made in the intersected pattern, thereby increasing flexibility of the design.

DETAILED DESCRIPTION OF PREFERRED EMBODIMENTS

Figure 1:
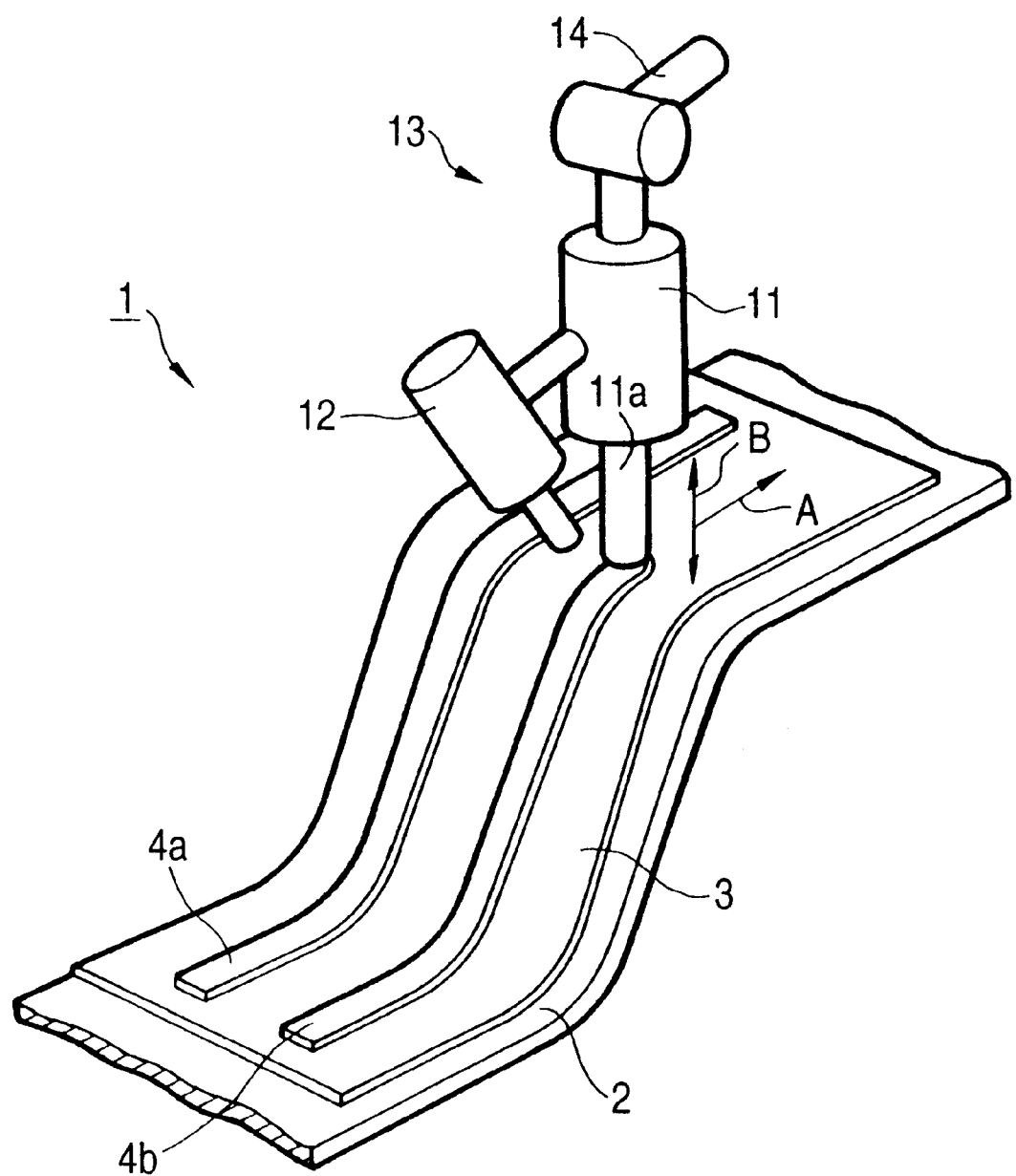
FIG. 1 is a perspective view of the first embodiment of the three-dimensional circuit body and a method of manufacturing the same according to the present invention.

Referring now to FIG. 1, a first embodiment of the three-dimensional circuit body and a method of manufacturing the same will now be described in detail. FIG. 1 is a perspective view showing the structure of the three-dimensional circuit body and the method of forming the circuit pattern.

As shown in FIG. 1, the three-dimensional circuit body 1 of the present embodiment is formed by the steps of forming an insulating layer 3 formed of a resin on the surface of the car body frame 2 that is three-dimensionally curved or bent, and forming circuit patterns 4a and 4b on the surface of the insulating layer 3. In other words, the circuit patterns 4a and 4b are formed directly by applying conductive paste described below instead of wire harness that is conventionally provided on the surface of the car body frame 2.

The car body frame 2 is formed of a conductive metal, and has a three-dimensional configuration having various projections and depression, or corrugations for reasons of design. The insulating layer 3 electrically insulates between the car body frame 2 and the circuit patterns 4a and 4b. While, a synthetic resin such as phenol in the shape of a thin membrane applied by splaying or the like is used in the present embodiment, it is also possible to adhere the same in the film shape onto the corresponding part.

The circuit pattern 4a and 4b are formed by applying conductive paste on the banded insulating layer 4 of a prescribed width (generally 1 mm to 100 mm) on the prescribed position on the car body frame. The circuit pattern 4a in FIG. 1 shows the state that the application is completed, and the circuit pattern 4b shows the state being applied.

The conductive paste is made basically by adding conductive material such as copper powder or the like into the matrix having insulating property or high electrical resistance such as phenol resin or the like. The optimal viscosity of the conductive paste is in the range between 100 and 10000 Pa.s, and the mixing ratio of copper powder to phenol resin is 100–10000 phr. The conductive filler or conductive paste disclosed by the present inventor in Japanese Patent Laid-Open No.11-45616 is also applicable. It is not shown in the figure specifically as conductive paste because the conductive paste is cured simultaneously with the application to form the circuit pattern 4a and 4b.

As shown in FIG. 1, the circuit patterns 4a and 4b of the three-dimensional circuit body of this embodiment are formed by discharging the conductive paste from the discharge unit 11 onto the insulating layer 3 and simultaneously curing by the curing unit 12. The discharge unit 11 and the curing unit 12 are fixed on the arm 14 constituting a part of the arm robot 13, and are moved unitarily. In other words, according to this embodiment, the discharge unit 11 and the curing unit 12 move unitarily in the direction shown by the arrow A, and in the upward and downward directions shown by the arrow B as well depending on the height of the car body frame 2.

The discharging unit 11 may be a cylinder pump that discharges an amount of conductive paste from a nozzle 11a basically by applying a pressure. However, when the structure of the circuit is complicated, it is preferable to use a mono-pump, which is easily controllable in terms of discharge.

The curing unit 12 may be a lamp unit that irradiates near infrared rays or far infrared rays, or may be a unit using a lamp and hot air in combination. When the conductive paste is the type that is cured by UV, the UV lamp for curing by UV may be used.

The method of forming the three-dimensional circuit body will now be described. In this embodiment, the discharging unit 11 and the curing unit 12 are positioned below the inclined surface of the car body frame 2 having an insulating layer 3 thereon in advance.

Then, the discharge unit 11 and the curing unit 12 are moved unitarily in the direction of the arrow A, while discharging the conductive paste from the nozzle 11a and curing the same by the curing unit 12 simultaneously. When the discharging unit 11 and curing unit 12 reaches the inclined surface, the arm 14 is moved upward along the inclined surface in the direction of the arrow B, while discharging and curing the conductive paste simultaneously. When the unit reaches to the plane surface again, the unit is moved horizontally in the direction of the arrow A while discharging and curing a predetermined length of conductive paste. In this way, the circuit pattern 4a and 4b are formed while discharging and curing the conductive paste in the predetermined configuration.

As described thus far, in the tree-dimensional circuit body and the method of manufacturing the same according to this embodiment, the mold is not used for forming the circuit body, and the conductive paste forming the circuit pattern is discharged and cured by the existing arm robot. Therefore, the three-dimensional circuit body may be formed easily at low cost without impairing the environment.

Figure 2:
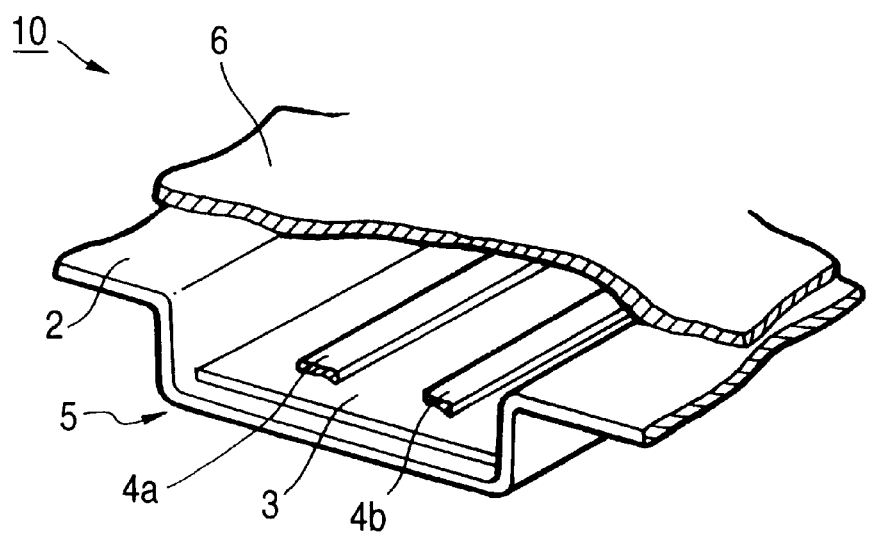
FIG. 2 is a perspective view of the second embodiment of the three-dimensional circuit body and a method of manufacturing the same according to the invention, showing the primary portions thereof.

Referring now to FIG. 2, the second embodiment of the three-dimensional circuit body and the method of manufacturing the same will be described in detail. FIG. 2 is a perspective view of the primary portion showing the structure of the three-dimensional circuit body 10. The difference between the first embodiment and the second embodiment is the shielding structure of the circuit pattern, and the same components in these embodiments are designated by the same reference numerals.

The wiring in the vehicle is provided not only for power supply, but also for control signals. Such wiring for signals has to be provided with a magnetic shield, and therefore, this embodiment relates to a magnetic shield for the circuit pattern.

As shown in FIG. 2, in the three-dimensional circuit body 10 of this embodiment, an insulating layer 3 is adhered on the bottom portion of the groove 5 formed on the car body frame 2 by adhesive or the like, and the circuit patterns 4a and 4b are formed on the surface thereof, and then the groove 5 is covered by the metal plate 6.

According to the three-dimensions circuit body of this embodiment, since the circuit patterns 4a and 4b are surrounded by the car body frame 2, which is a metallic plate, and a metal plate 6, even when signals of high frequency are applied to the circuit patterns 4a and 4b, they do not leak out of the groove 5. In this manner, by utilizing a part of the car body frame 2 and the metal plate 6 that can be used also for another purpose, the circuit pattern 4a and 4b can be magnetically shielded.

As for the formation of the circuit pattern 4a and 4b, the discharging unit 11 and the curing unit 12 as described in the first embodiment can be used, and the conductive paste is discharged and cured simultaneously.

The conductive paste described above forms an insulating layer on the surface thereof when it is discharged and cured simultaneously as in the embodiments above. By utilizing this property, the circuit patterns may be formed not only in parallel, but also in layers.

Figure 3:
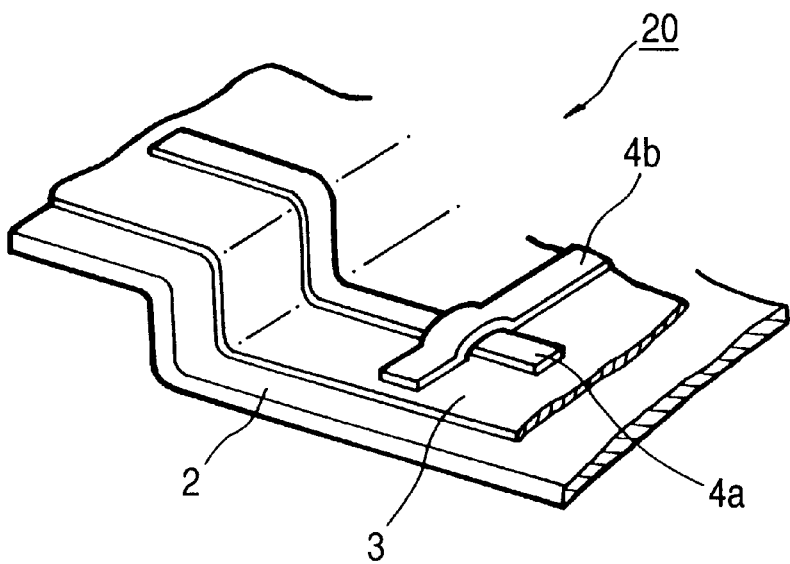
FIG. 3 is an exploded perspective view of the third embodiment of the three-dimensional circuit body and a method for manufacturing the same according to the present invention, showing the primary portion thereof.

Referring now to FIG. 3, the third embodiment of the three-dimensional circuit body and a method of forming the same according to the present invention will now be described in detail. This embodiment is focusing attention on the insulating layer formed on the surface of the circuit pattern, and FIG. 3 is a perspective view showing the primary portion of the three-dimensional circuit body 20.

The three-dimensional circuit body 20 of this embodiment is constructed in such a manner that the circuit patterns 4a and 4b are intersecting on the surface of the insulating body 3 formed on the car body frame 2 along its configuration. When forming the three-dimensional circuit body 20, the circuit pattern 4a is formed by the discharging unit 11 and the curing unit 12 first, and then the direction of movement of the discharging unit 11 and the curing unit 12 is switched to form the circuit pattern 4b.

The surface of the circuit pattern 4a is changed to have an insulating property when cured by the curing unit 12. More specifically, the surface of the conductive paste is changed to have an insulating property when copper powder in phenol resin is moved toward the center along the cross section of the circuit pattern when the surface of the conductive paste is cured suddenly.

Therefore, even when the circuit pattern 4b is formed after the formation of the circuit pattern 4a so that a part of the circuit pattern 4b is superimposed on the circuit pattern 4a, the circuit pattern 4a and 4b are not electrically connected, and thus can be used for sending and receiving signals respectively as an independent wiring. Therefore, by forming the circuit patterns 4a and 4b in an intersecting manner, flexibility of wiring may be enhanced, and thus the flexibility of the design of the motor vehicle itself may be enhanced as well.

The intersection of the circuit patterns 4a and 4b is not limited to one point, but the more number of circuit patterns may be intersected with respect to each other. By interposing an insulating material at these intersecting points, the more reliable three-dimensional circuit body may be obtained. In other words, an insulating material may be interposed easily between the circuit patterns 4a and 4b by applying or adhering an insulating material on the point of the circuit pattern 4a on which the circuit pattern 4b is to be overlaid before forming the circuit pattern 4b thereon.

As is described thus far, the three-dimensional circuit body according to the invention comprises a car body frame of the three-dimensional configuration, an insulating layer formed along the surface of the car body frame corresponding to the configuration of the surface thereof, and a circuit pattern formed by applying a conductive paste on the surface of the insulating layer and curing it simultaneously. Therefore, the conductive paste may be applied along the surface configuration of the car body frame that varies three-dimensionally, thereby simplifying the formation of the circuit pattern and reducing the cost thereof.

In the tree-dimensional circuit body, the insulating layer is preferably a hard material formed along the surface configuration of the car body frame, or a flexible material that can be adhered along the surface of the car body frame, or a thin film formed in a layer.

In the three-dimensional circuit body of the invention, the circuit pattern is preferably formed in a configuration being separated or being intersected with respect to each other.

Therefore, the mold for forming the circuit pattern is not necessary any more, and the circuit pattern may be formed either in separate or in partly intersecting configuration depending on the wiring position of the circuit pattern, thereby decreasing the cost or improving the flexibility of the wiring.

In addition, in the method of manufacturing the three-dimensional circuit body according to the invention, the circuit pattern is formed by moving the discharging unit along the surface configuration of the insulating layer formed along the three-dimensional car body frame, discharging the conductive paste on the insulating layer from the discharging unit and simultaneously curing the conductive paste by the curing unit that moves with the discharging unit unitarily.

Therefore, even when the surface of the car body frame is three-dimensionally curved or bent, the circuit pattern may be formed along the configuration thereof, thereby simplifying the manufacturing process of the circuit body and reducing consumption of material.

In the method of manufacturing the three-dimensional circuit body, the conductive paste is preferably made by adding phenol resin to conductive metal powder so that the surface thereof is changed to have an insulating property when cured. Therefore, the intersected circuit pattern may be easily formed, thereby enhancing flexibility of design.

What is claimed is:

1. A three-dimensional circuit body comprising:
   a three-dimensional conductive member having at least one cured surface;
   an insulating layer applied along the curved surface of said three-dimensional member; and
   a circuit pattern formed by applying conductive paste on the surface of said insulating layer and curing the same simultaneously.

2. A three dimensional circuit body as set forth in claim 1, wherein said insulating layer is defined by one of a hard material formed along the surface configuration of said three-dimensional substance, a soft material to be adhered along the surface of said three-dimensional substance, and a thin film formed in a layer.

3. A three-dimensional circuit body as set forth in claim 1 wherein said circuit patterns include a configuration in which said conductive paste is applied in strips that are one of separated and intersected with respect to each other.

4. A method of manufacturing a three dimensional circuit body comprising the steps of:
   moving a discharging unit along the surface configuration of the insulating layer formed along a surface of a three-dimensional substance;
   discharging the conductive paste from said discharging unit onto said insulating layer; and
   curing said conductive paste by moving a curing unit in a unitary manner with said discharging unit simultaneously with the discharging step.

5. A method of manufacturing a three-dimensional circuit body as set forth in claim 4, wherein said conductive paste is made by adding phenol resin to conductive metal powder so that the surface thereof is changed to have an insulation property when cured.

* * * * *